United States Patent [19]

Shirato

[11] 4,178,608

[45] Dec. 11, 1979

[54] CONTRAST/COLOR CONTROL FOR A TELEVISION RECEIVER

[75] Inventor: Keiji Shirato, Tokyo, Japan

[73] Assignee: Sony Corporation, Tokyo, Japan

[21] Appl. No.: 889,550

[22] Filed: Mar. 23, 1978

[30] Foreign Application Priority Data

Apr. 7, 1977 [JP] Japan .................................. 52-39686

[51] Int. Cl.² ............................................. H04N 9/12
[52] U.S. Cl. .................................... 358/21 R; 358/27; 358/39; 358/40; 358/169
[58] Field of Search ....................... 358/21, 27, 39, 40, 358/169

[56] References Cited

U.S. PATENT DOCUMENTS

| 3,715,463 | 2/1973 | Matzek | 358/39 |
| 3,967,313 | 6/1976 | Miyamoto | 358/27 |

Primary Examiner—Robert L. Richardson
Attorney, Agent, or Firm—Lewis H. Eslinger; Alvin Sinderbrand

[57] ABSTRACT

Control circuitry for selectively controlling the contrast of a video picture displayed by a television receiver and for selectively controlling the color level of the video picture. The television receiver is of the type which has a controllable video amplifier for amplifying a luminance signal and a controllable chrominance amplifier for amplifying a chrominance signal. The control circuitry includes pulse generating circuits for generating contrast control pulses of selectively variable duty cycle and color level control pulses of selectively variable duty cycle. A contrast control circuit is responsive to the contrast control pulses for generating a contrast control signal in accordance with the duty cycle of the contrast control pulses. The produced contrast control signal is used to control the gain of the video amplifier so as to correspondingly control the contrast of the video picture. A color control circuit responsive to the color level control pulses generates a color level control signal in accordance with the duty cycle of the color level control pulses, and the color level control signal is changed proportionally with a change in the contrast control signal so as to maintain a substantially constant chrominance-to-luminance signal ratio despite changes in the contrast control signal. The color level control signal is used to control the gain of the chrominance amplifier so as to correspondingly control the color level of the video picture.

In one embodiment, the duty cycles of the contrast control pulses and of the color level control pulses are remotely controlled, as by ultrasonic transmitting-/receiving devices.

9 Claims, 5 Drawing Figures

CONTRAST/COLOR CONTROL FOR A TELEVISION RECEIVER

BACKGROUND OF THE INVENTION

This invention relates to control circuitry for controlling the video picture displayed by a television receiver and, more particularly, to contrast and color level control circuitry capable of adjusting the contrast and color level of the video picture in response to remotely transmitted command signals.

In a typical color television receiver which includes a luminance channel and a chrominance channel, the contrast of the video picture displayed by the television receiver is controlled by selectively adjusting the gain of the luminance channel in accordance with a viewer's preference. If the gain of the luminance channel is, for example, increased, the luminance signal which is processed by that channel is, correspondingly, increased. For a monochrome, or black-and-white video picture, the contrast likewise is increased. However, for a color video picture, if the chrominance signal is not changed as the luminance signal changes, then the chrominance-to-luminance signal ratio, or C/Y, will not remain constant. That is, and in accordance with the foregoing example, if the luminance signal is increased without a concommitent increase in the chrominance signal, then the chrominance-to-luminance signal ratio C/Y decreases. As a consequence thereof, the resultant increase in contrast has the visual effect of reducing the overall color level of the video picture.

Accordingly, to avoid the aforenoted defect, it is not unusual to provide some intercoupling between the contrast control circuit and the color level control circuit in a color television receiver. That is, provision is made to proportionally change the chrominance signal level when the luminance signal level is changed, thereby adjusting the color level with adjustments in contrast so as to maintain a constant chrominance-to-luminance signal ratio C/Y.

The gain of the luminance signal in a color television receiver readily is controlled by using a gain-controlled video amplifier. Similarly, the gain of the chrominance signal, that is, the color level of the video picture, readily is controlled by using a gain-controlled chrominance amplifier. Hence, contrast adjustments are effected by selectively adjusting the gain-controlling bias voltage applied to the video amplifier. In like manner, adjustments in the color level are made by selectively adjusting the gain-controlling bias voltage which is applied to the chrominance amplifier. Typically, these bias voltages are derived from adjustable resistors, such as potentiometers. A reference voltage is applied across a contrast adjustment potentiometer such that the contrast adjustment bias voltage is a function of the position of the tap of this potentiometer. Similarly, a voltage is applied across the color level adjustment potentiometer, and the color level bias voltage is determined by the position of the tap of this potentiometer. In order to insure that a change in the contrast adjustment bias voltage is accompanied by a proportional change in the color level adjustment bias voltage so that the chrominance-to-luminance signal ratio C/Y remains constant, the voltage which is applied across the color level adjustment potentiometer is derived from the output of the contrast adjustment potentiometer. Hence, an adjustment in the contrast of the displayed video picture is accompanied by a change in the voltage applied across the chrominance adjustment potentiometer, thereby producing a proportional change in the color level adjustment bias voltage which is applied to the chrominance amplifier. Therefore, a corresponding change in the color level is obtained, while maintaining a substantially constant C/Y ratio.

While the foregoing contrast and color level control circuitry operates satisfactorily in response to manual adjustments to the respective potentiometers, it generally is not susceptible of being remotely controlled. In a television receiver adapter for remote control over various functions, ultrasonic signals or infrared light signals are used to control particular functions from a remote location. For example, a viewer is provided with a transmitter, and the television receiver is provided with a compatible receiving device. Various command signals, such as power on/off, channel selection, and the like modulate or encode an ultrasonic wave or an infrared light wave in response to the viewer's selection. The compatible receiving device at the television receiver receives and demodulates the modulated ultrasonic wave or infrared light wave so as to reproduce the particular commond signal which, in turn, controls the appropriate on/off or channel selection function, or the like. With this type of remote-control trasmitting/receiving apparatus, it is quite difficult to obtain an economical technique for controlling the above-mentioned contrast adjustment and color level adjustment potentiometers. This is because such potentiometers would have to be adjusted by selectively energizable motors. The use of such motors and suitable control circuitry therefor is very expensive.

Although it may present no substantial difficulty in providing a remote control operation over contrast adjustment, this generally will be achieved without a concommitent adjustment in the color level of the displayed video picture. This is because remote control over contrast would be accomplished without the use of potentiometers, and especially intercoupled contrast adjustment and color level adjustment potentiometers. Hence, the contrast and color level control circuitry heretofore known to the prior art suffers from the disadvantage that proper contrast and color level adjustments cannot be made by remote control. At best, separate adjustments can be achieved independently of each other, thereby changing the desirably constant chrominance-to-luminance ratio C/Y when contrast is adjusted.

OBJECTS OF THE INVENTION

Therefore, it is an object of the present invention to provide improved contrast and color level control circuitry for use in a color television receiver.

Another object of this invention is to provide control circuitry whereby the contrast of a color video picture can be adjusted with a concommitent, automatic adjustment in the color level of the picture, thereby maintaining a substantially constant chrominance-to-luminance signal ratio.

A still further object of this invention is to provide an improved contrast and color level control circuitry which avoids the reliance upon adjustable resistors for achieving contrast and color level adjustments.

Another object of this invention is to provide contrast and color level control circuitry which can be adjusted by remote control, and wherein an adjustment in the contrast is accompanied by a concommitent adjustment in the color level such that a substantially constant chrominance-to-luminance signal ratio is maintained in the displayed color video picture.

An additional object of this invention is to provide improved contrast and color level control circuitry which is adjustable by remote control and wherein an adjustment in the color level can be achieved without an accompanying adjustment in contrast, but an adjustment in contrast is accompanied by a proportional adjustment in color level.

Various other objects, advantages and features of the present invention will become readily apparent from the ensuing detailed description, and the novel features will be particularly pointed out in the appended claims.

SUMMARY OF THE INVENTION

In accordance with the present invention, control circuitry for selectively controlling the contrast and color level of a video picture displayed by a television receiver is provided. The television receiver is of the type having a controllable video amplifier for amplifying a luminance signal and a controllable chrominance amplifier for amplifying a chrominance signal. The control circuitry is provided with pulse generating circuits for generating contrast control pulses of selectively variable duty cycle and color level control pulses of selectively variable duty cycle. A constrast control circuit is responsive to the contrast control pulses for generating a contrast control signal in accordance with the duty cycle of the contrast control pulses, this contrast control signal being used to control the gain of the video amplifier so as to correspondingly control the contrast of the video picture. A color level control circuit is responsive to the color level control pulses for generating a color level control signal in accordance with the duty cycle of the color level control pulses, the color level control signal being used to control the gain of the chrominance amplifier so as to correspondingly control the color level of the video picture. A circuit is provided to change the color level control signal proportionally with a change in the contrast control signal so as to maintain a substantially constant chrominance-to-luminance signal ratio despite changes in the contrast control signal.

In accordance with one embodiment, the control circuitry is responsive to remote contrast and color level command signals, which signals selectively change the duty cycles of the contrast and color level control pulses in accordance with a desired adjustment in the contrast and color level of the video picture.

BRIEF DESCRIPTION OF THE DRAWINGS

The following detailed description, given by way of example, will best be understood in conjunction with the accompanying drawings in which.

DETAILED DESCRIPTION OF CERTAIN PREFERRED EMBODIMENTS

Figure 1:
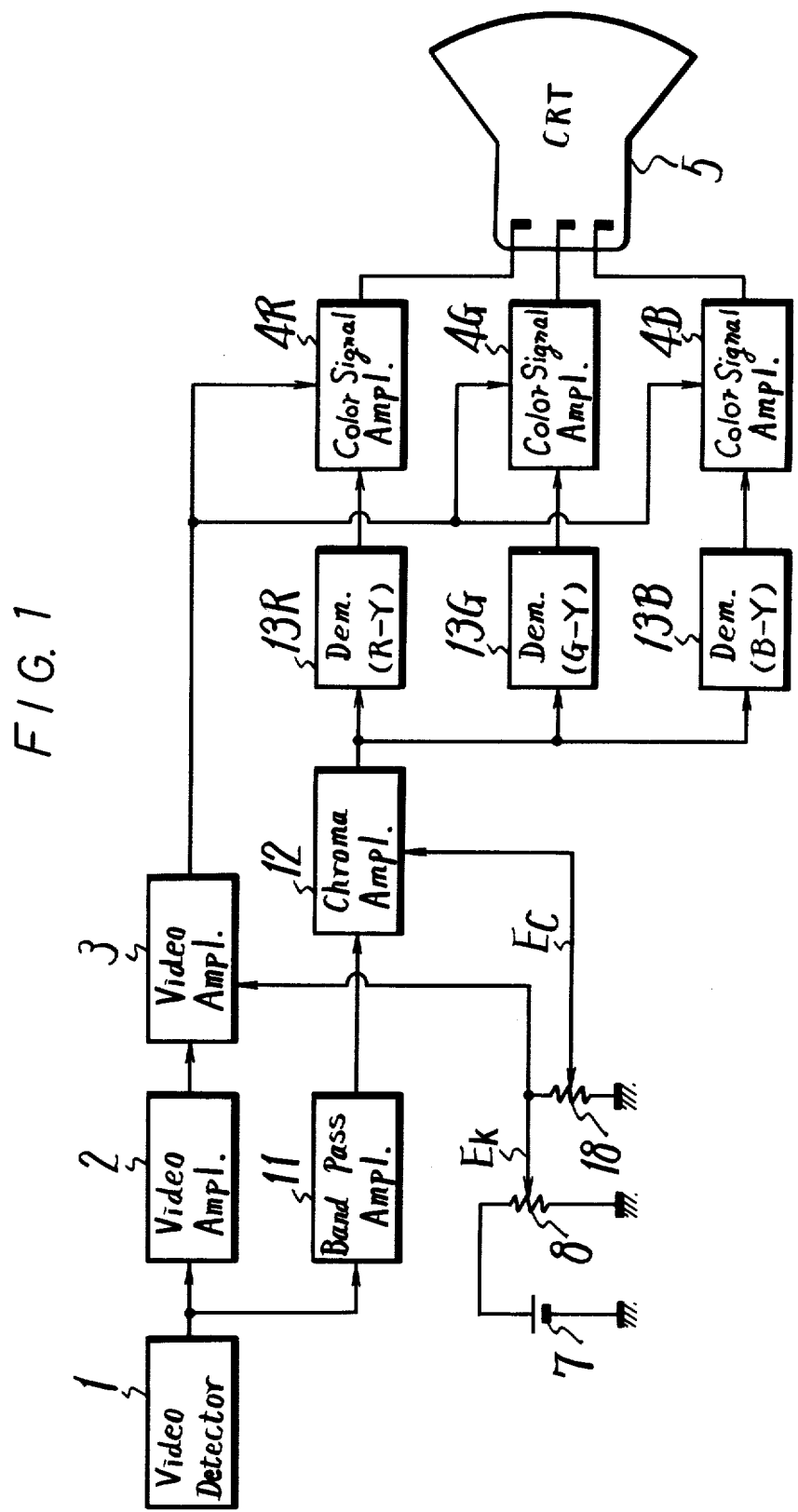
FIG. 1 is a block diagram of a portion of a color television receiver in which contrast and color level adjustment circuitry is provided.

Referring now to the drawings, wherein like reference numerals are used throughout, and in particular to FIG. 1, there is illustrated a block diagram of a portion of color television receiving apparatus with which contrast and color level control circuitry is provided. The color television receiving apparatus includes a video detector 1, a luminance channel comprised of cascaded video amplifiers 2 and 3 coupled to the output of video detector 1 and a chrominance channel comprised of a band pass amplifier 11, a chrominance amplifier 12, color demodulators 13R, 13G and 13B and color signal amplifiers 4R, 4G and 4B, the chrominance channel also being coupled to the output of video detector 1. The video detector is supplied with a composite color television signal and is adapted to demodulate the video signal from the received signal. Video amplifier 2 derives the luminance signal Y from the demodulated video signal, and this luminance signal is supplied to video amplifier 3. Video amplifier 3 is a gain-controlled amplifier having a control input connected to receive a gain-controlling bias voltage for correspondingly adjusting the level of the luminance signal Y amplified thereby. The gain-controlled luminance signal Y produced by video amplifier 3 is supplied to the respective color signal amplifiers 4R, 4G and 4B, which function as conventional matrix amplifiers.

Band pass amplifier 11 derives the chrominance signal from the demodulated video signal produced by video detector 1. This chrominance signal is of the usual type wherein color signal information is modulated onto a subcarrier. Chrominance amplifier 12, connected to band pass amplifier 11, is a gain-controlled amplifier and includes a control input connected to receive a gain-controlling bias voltage, whereby the gain of the chrominance signal amplified thereby is selectively controlled. This gain-controlled chrominance signal is supplied to respective red (R-Y), green (G-Y) and blue (B-Y) color difference signal demodulators 13R, 13G and 13B, respectively. Although not shown herein, a demodulating subcarrier of respective phase also is supplied to the color difference signal demodulators for demodulating the red, green and blue color difference signals from the chrominance signal.

Red, green and blue color signal amplifiers 4R, 4G and 4B, respectively, function as matrix amplifiers for combining the luminance signal Y from video amplifier 3 with the respective red, green and blue color difference signals from demodulators 13R, 13G and 13B to produce respective red, green and blue color drive signals. In particular, each color signal amplifier adds the luminance signal Y to the color difference signal supplied thereto and then amplifies the resultant color drive signal. The red, green and blue color drive signals are supplied to respective cathodes in a cathode ray tube 5 to control the beam intensities of the red, green and blue electron beams. Hence, as these beams scan a raster across the screen of the cathode ray tube, a color video picture is displayed.

FIG. 1 also shows a contrast control circuit comprised of an adjustable resistor 8, such as a potentiometer, coupled to a source of energizing potential 7. The output of adjustable resistor 8, such as the tap of the potentiometer, is connected to the control input of video amplifier 3 for supplying a gain-controlling bias voltage thereto. Also shown is a color level control circuit comprised of an adjustable resistor 18, which also may be a potentiometer, connected to be supplied with an energizing potential having the output thereof connected to the control input of chrominance amplifier 12. Let it be assumed that the bias voltage supplied to video amplifier 3 by potentiometer 8 is represented as $E_k$, and that the bias voltage supplied to chrominance amplifier 12 by potentiometer 18 is represented as $E_c$. As potentiometer 8 is adjusted to increase bias voltage $E_k$, the gain of video amplifier 3 is increased to correspondingly increase the contrast of the displayed video picture. Similarly, as potentiometer 18 is adjusted to increase the bias voltage $E_c$, the gain of chrominance amplifier 12 is increased to correspondingly increase the color level of the displayed video picture. These adjustments to potentiometers 8 and 18 are made in accordance with a viewer's preference.

Let it be assumed that the voltage applied across potentiometer 18 for controlling the gain of chrominance amplifier 12 is fixed. This, of course, means that if the contrast adjustment bias voltage $E_k$ is changed, there will be no accompanying change in the color level bias voltage $E_c$. Consequently, the levels of the respective color difference signals produced by demodulators 13R, 13G and 13B may be thought of as remaining constant, while the level of the luminance signal Y is changed. If potentiometer 8 is adjusted so as to increase the luminance signal level, the contrast of the displayed video picture is made stronger. However, since the chrominance signal level has not been changed, the chrominance-to-luminance signal ratio C/Y is reduced as the luminance signal level increases. As a result thereof, the displayed video picture will appear to have reduced color levels because of the increase in contrast. To compensate for this, it is expected that a viewer now would adjust potentiometer 18 so as to increase the color level of the displayed video picture.

In the contrast and color level control circuit shown in FIG. 1, the energizing potential supplied across color level potentiometer 18 is derived from the output of potentiometer 8. That is, and as shown, potentiometer 18 is connected to the tap of potentiometer 8 such that the contrast bias voltage $E_k$ is used as the energizing potential for color level potentiometer 18. This means that the color level bias voltage $E_c$ is not independent of the contrast bias voltage. As potentiometer 8 is adjusted to achieve an adjustment in the contrast of the displayed video picture, a proportional change in the energizing potential across potentiometer 18 is effected, resulting in a proportional change in the color level bias voltage $E_c$. That is, the relationship between the color level bias voltage $E_c$ and the contrast bias voltage $E_k$ may be expressed as $E_c = kE_k$, where k is the dividing ratio of potentiometer 18. Therefore, an adjustment in the contrast of the displayed video picture will be accompanied by a proportional adjustment in the color level thereof. The chrominance-to-luminance signal ratio C/Y will remain constant. However, although the color level bias voltage $E_c$ will automatically be proportionally adjusted in accordance with an adjustment in the contrast bias voltage $E_k$, the reverse of this does not result. That is, the color level of the displayed video picture can be adjusted without a concommitent change in the contrast thereof. A manual adjustment to potentiometer 18 will change the color level bias voltage $E_c$, and thus the gain of chrominance amplifier 12, but will have no effect upon the contrast bias voltage $E_k$ or the gain of video amplifier 3.

Accordingly, if a viewer desires to adjust the contrast of the displayed video picture, a proportional adjustment in the color level automatically is attained so that a proper video picture is displayed without requiring successive compensating adjustments by the viewer to the contrast and color level.

As mentioned hereinabove, potentiometers 8 and 18 are not easily and economically controllable from a remote location by remote control transmitting and receiving apparatus, such as ultrasonic or infrared remote control devices. Hence, adjustments in the luminance signal level heretofore have been achieved by remote control without adjusting potentiometers 8 and 18. This means that if the gain of video amplifier 3 is increased by remote control, there will not be a concommitent increase in the gain of chrominance amplifier 12. Rather, separate remote control operations heretofore have been necessary first to change the gain of video amplifier 3, to attain an adjustment in contrast, and then to change the gain of chrominance amplifier 12, to attain an adjustment in the color level so as to compensate for the adjustment in contrast. In accordance with one embodiment of the present invention, shown in FIG. 2, the gain of video amplifier 3 is controllable from a remote location with a concommitent adjustment in the gain of chrominance amplifier 12. Also, the gain of chrominance amplifier 12 is adjustable from a remote location, but without a corresponding change in the gain of video amplifier 3.

Figure 2:
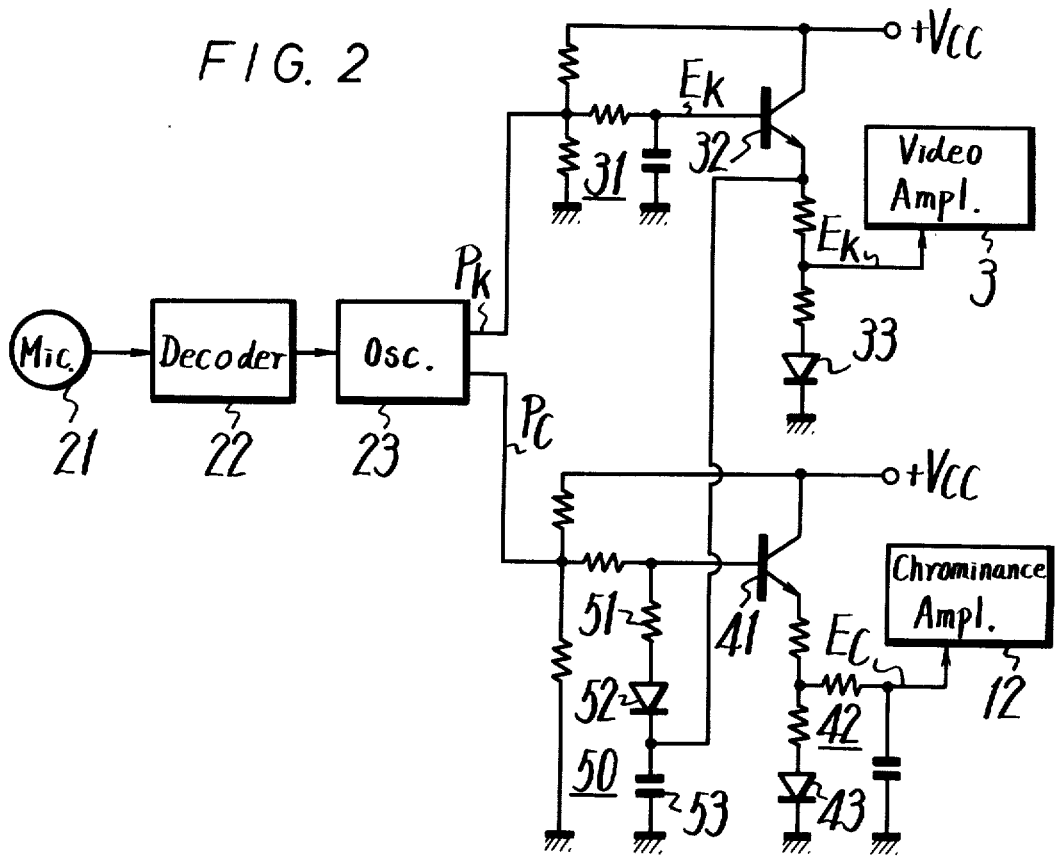
FIG. 2 is a circuit diagram of one embodiment of the present invention.

As shown in FIG. 2, the contrast and color level control circuitry is comprised of a pulse generator 23, such as an oscillator, a contrast control circuit including an integrator 31 and an emitter-follower transistor 32, a color level control circuit including an emitter-follower transistor 41 and an integrator 42, and a circuit 50 for modifying the color level bias voltage proportionally with a change in the contrast bias voltage. Pulse generator 23 is adapted to generate contrast control pulses $P_k$ and color level control pulses $P_c$, each having controllable duty cycles. That is, if the control pulses are rectangular pulses having ON and OFF durations, these pulses are of constant period but the ratio of the ON to OFF durations are controllably varied. A change in the duty cycle of the contrast or color level control pulses is caused by contrast or color level command signals which are generated by a viewer. Such command signals may be generated in response to manual adjustments made to control switches or knobs on the chassis of the television receiver or, as shown in FIG. 2, are generated in response to remote control signals. As one example, an ultrasonic transmitter (not shown) may be provided to generate various command signals, including contrast increase/decrease signals and including color level increase/decrease signals. These signals may be characterized by different ultrasonic frequencies. A microphone 21, provided at the television receiver, receives these ultrasonic signals and converts them to corresponding electrical signals for decoding in a suitable decoder 22. Decoder 22 supplies the respective contrast and color level command signals to pulse generator 23 whereat the duty cycles of the contrast control pulses $P_k$ and the color level control pulses $P_c$ are controlled in response to such command signals. As is appreciated, other remote control transmitting/receiving apparatus may be used, if desired, such as infrared devices, or the like.

Contrast control pulses $P_k$ are supplied to integrator 31 of the contrast control circuit, whereat the contrast control pulses are integrated to produce a time integral contrast control signal $E_k$. As is appreciated, the level of this time integral contrast control signal is determined by the duty cycle of contrast control pulses $P_k$. As this duty cycle increases, contrast control signal $E_k$ likewise increases; and as the duty cycle decreases, the contrast control signal also decreases.

Emitter-follower transistor 32 has its input, or base electrode, connected to integrator 31 and its output, or emitter electrode, connected to the control input of video amplifier 3 for supplying contrast bias voltage $E_k$ thereto. Except for the base-emitter voltage drop of emitter-follower transistor 32, it is recognized that the contrast bias voltage $E_k$ is substantially equal to the time integral contrast control signal $E_k$ produced by integrator 31. In addition, a diode 33 is connected in the emitter circuit of emitter-follower transistor 32 for the purpose of temperature compensation, as is conventional.

In the color level control circuit shown in FIG. 2, color level control pulses $P_c$ are supplied to the input, or base electrode of emitter-follower transistor 41. The output, or emitter electrode of the emitter-follower transistor is connected to integrator 42 which integrates the color level control pulses $P_c$ supplied thereto, thereby producing a time integral color level control signal $E_c$. This time integral color level control signal is equal to the color level bias voltage $E_c$ mentioned in FIG. 1, and is supplied to the control input of chrominance amplifier 12 so as to determine the gain of the chrominance amplifier. A diode 43 is connected in the emitter circuit of emitter-follower transistor 41 for the purpose of temperature compensation.

Circuit 50, which is provided for changing the color level bias voltage $E_c$ proportionally with a change in the contrast bias voltage $E_k$ operates as an amplitude modulating circuit. That is, the amplitude, or height of each color level control pulse is modulated as a function of the contrast bias voltage $E_k$. Modulating circuit 50 is shown as a slicing circuit comprised of a resistor 51, a diode 52 and a capacitor 53 connected in series between the base electrode of emitter-follower transistor 41 and a reference potential, such as ground. Diode 52 is poled so as to be forward biased in response to positive color level control pulses $P_c$. However, the diode is provided with a slicing level proportional to the contrast bias voltage $E_k$ by reason of the connection between the cathode of diode 52 and the emitter electrode of emitter-follower transistor 32. This slicing level establishes the conduction level of diode 52. That is, if the amplitude, or height, of a color level control pulse is less than the slicing level, the full amplitude of this color level control pulse is supplied through emitter-follower transistor 41 to be integrated by integrator 42. However, if the amplitude, or height of a color level control pulse exceeds the slicing level, that is, if the height of the color level control pulse is greater than the contrast bias voltage $E_k$, then diode 52 conducts so as to limit the amplitude of the pulse supplied through emitter-follower transistor 41 to be no greater than the slicing level. That is, the slicing circuit functions to "slice off" that portion of a color level control pulse which exceeds the slicing level established by contrast bias voltage $E_k$.

Figure 3A:
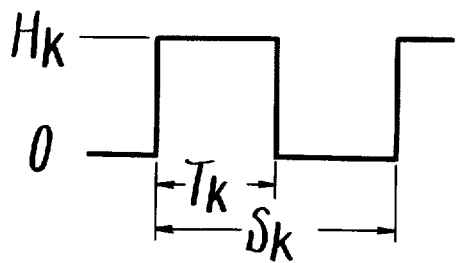
FIGS. 3A and 3B are waveform diagrams which are useful in understanding the operation of the circuit shown in FIG. 2.

The operation of the circuitry shown in FIG. 2 now will be described with reference to FIGS. 3A and 3B. Let it be assumed that a change in the contrast of the displayed video picture is commanded. Hence, the duty cycle of contrast control pulses $P_k$ is changed accordingly. Let it be further assumed that this duty cycle is increased so as to increase the contrast of the video picture. Thus, contrast control pulses $P_k$ will have an amplitude $H_k$, an ON duration $T_k$ and a duty cycle $T_k/S_k$ (FIG. 3A). As a result of this duty cycle, contrast bias voltage $E_k$ will be produced at a level corresponding to the desired contrast. This, in turn, establishes the gain of video amplifier 3 to the proper level.

Figure 3B:
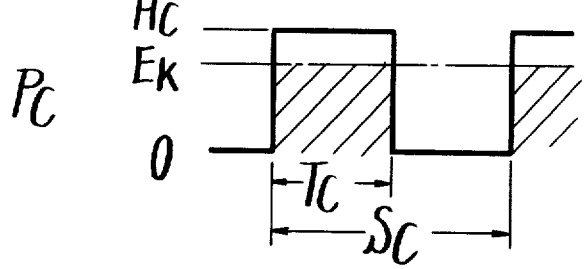

Let it be further assumed that color level control pulses $P_c$ have an amplitude $H_c$, an ON duration $T_c$ and a duty cycle $T_c/S_c$ (FIG. 3B). The slicing circuit is supplied with a slicing level proportional to the contrast bias voltage $E_k$, and as shown in FIG. 3B, this slicing level is represented as $E_k$. It is here assumed that the amplitude $H_c$ of color level control pulses $P_c$ is greater than the slicing level $E_k$. This means that the amplitude of the pulses $P_c$ which are supplied through emitter-follower transistor 41 from the slicing circuit to integrator 42 are "sliced off" above the slicing level. Hence, only that portion of the color level control pulses $P_c$ represented by the cross-hatched area is supplied to and integrated by integrator 42. The integrated signal produced by integrator 42 is determined by the amplitude of the pulses supplied thereto and the duty cycle of such pulses. It is readily apparent that the amplitude of the color level control pulses $P_c$ which are supplied to integrator 42 is modulated by the contrast bias voltage $E_k$. Hence, the time integral color level signal $E_c$ varies as the contrast bias voltage $E_k$ varies even if duty cycle $T_c/S_c$ of the color level control pulses remains constant. Since the contrast bias voltage $E_k$ is a function of the duty cycle of the contrast control pulses $P_k$, it is recognized that the slicing circuit functions as an amplitude modulating circuit to change the time integral color level signal $E_c$ as a function of the contrast control pulses $P_k$, and specifically, as a function of the duty cycle of these contrast control pulses.

If the viewer wishes to change the color level of the displayed video picture, a suitable color level command signal is transmitted and is decoded so as to correspondingly change the duty cycle of the color level control pulses $P_c$. Although the amplitude of these color level control pulses supplied through emitter-follower transistor 41 to integrator 42 still is modulated by contrast bias voltage $E_k$, as discussed above, the duty cycle $T_c/S_c$ varies independently of the contrast bias voltage. As a result of this change in the duty cycle of color level control pulses $P_c$, a corresponding time integral color level bias signal $E_c$ is produced by integrator 42 and supplied as a gain controlling signal to chrominance amplifier 12. In particular, if a decrease in color level is commanded, the duty cycle of the color level control pulses is reduced so as to correspondingly reduce the color level bias voltage $E_c$. Conversely, if an increase in the color level is commanded, the duty cycle of the color level control pulses is increased so as to correspondingly increase the color level bias voltage.

Preferably, a contrast or color level command signal is generated in the form of pulse bursts of an ultrasonic carrier. An increase in contrast or color level may be commanded by a particular frequency of the ultrasonic carrier or duration of the pulse bursts. Conversely, a decrease in the contrast or color level may be represented by another frequency of the ultrasonic carrier or duration of the ultrasonic pulse bursts. Of course, distinguishing characteristics, such as frequency, are used to distinguish between a commanded contrast or color level adjustment. If an increase in contrast or color level is commanded, the duty cycle of the contrast or color level control pulses $P_k$ or $P_c$, respectively, is increased, as mentioned above. Once a desired contrast or color level is achieved, the last-attained duty cycle is retained. The converse of this operation is carried out in response to a commanded reduction in contrast or color level. Thus, while the period $S_k$ or $S_c$ of the contrast or color level control pulses $P_k$ or $P_c$ remains fixed, and while the amplitude, or height, $H_k$ or $H_c$ of these pulses also remains fixed, the duty cycle thereof, that is, the ON duration $T_k$ or $T_c$ is adjusted in a step-wise manner corresponding to a commanded increase or decrease in contrast or color level. Preferably, each step-wise change in the duty cycle of the respective pulses is of a constant step. As just mentioned, to maintain the contrast or color level of the displayed video picture at the selected amount, the last-attained duty cycle of the respective pulses is maintained even in the absence of a command signal.

In accordance with the foregoing description, it is appreciated that the color level control pulses which are supplied by emitter-follower transistor 41 to integrator 42 are in the form of pulse width modulated (PWM) pulses, representing the desired or commanded adjustment to the color level of the displayed video signal, and amplitude modulated pulses, this amplitude modulation being determined by the level of the contrast bias voltage $E_k$. Thus, the color level bias voltage $E_c$ is represented as the product of the duty cycle of the color level control pulses and the contrast bias voltage, or $$E_c = (T_c \cdot E_k)/(S_c)$$

Hence, a change in contrast, that is, a change in the contrast bias voltage $E_k$, results in a proportional change in color level, that is, a proportional change in the color level bias voltage $E_c$. Consequently, the chrominance-to-luminance ratio remains constant. This means that the ratio of the gains of video amplifier 3 and chrominance amplifier 12 likewise remain constant. Desirably, both of these amplifiers exhibit similar linear gain characteristics; and, therefore, an adjustment in the contrast of the reproduced picture is accompanied by a proportional adjustment in the color level thereof. A viewer thus would not perceive an undesired change in the apparent color level of the reproduced picture in the event that he changes the contrast thereof.

Figure 4:
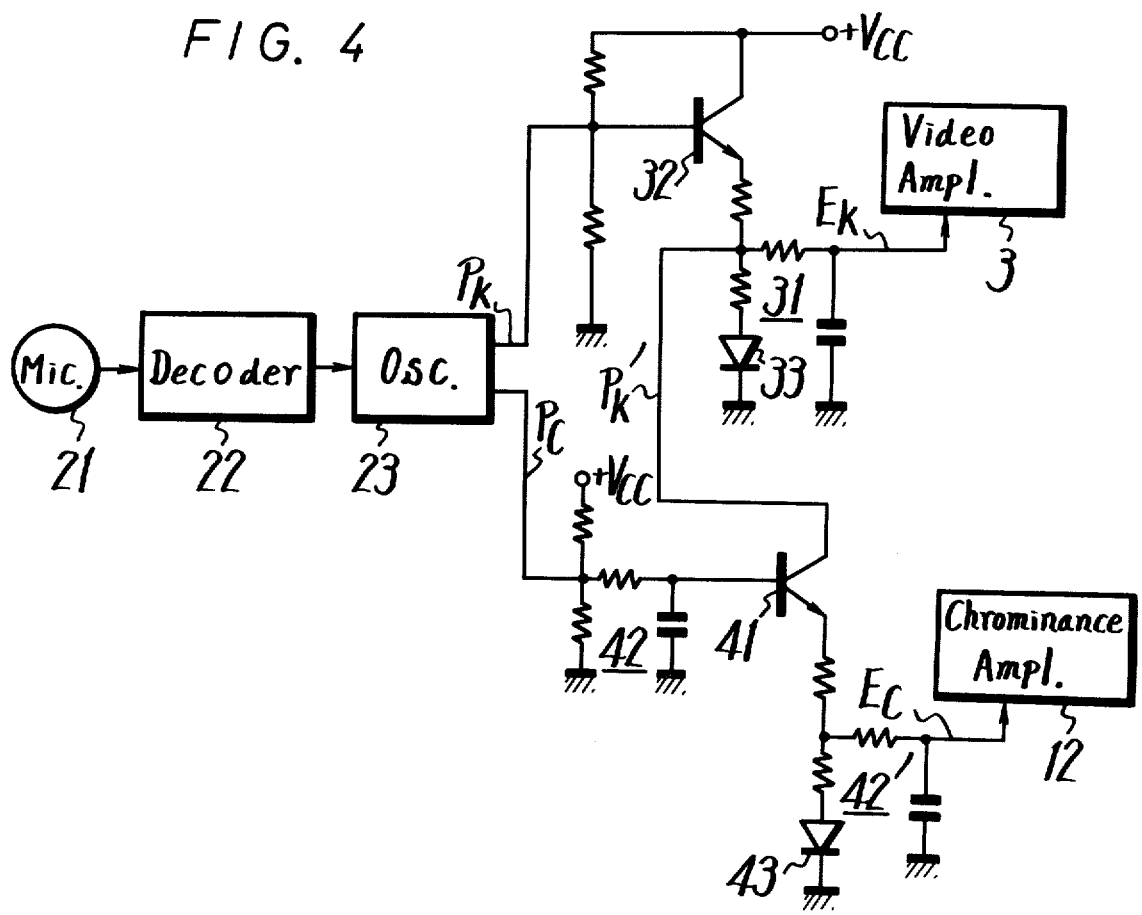
FIG. 4 is a circuit diagram showing another embodiment of the present invention.

Another embodiment of the present invention is shown in the circuit diagram of FIG. 4 wherein the same reference numerals used in FIG. 2 identify corresponding elements in FIG. 4. The differences between these respective embodiments are that in FIG. 4, integrator 31 is not connected between the output of pulse generator 23 and emitter-follower 32, as in FIG. 4. Rather, integrator 31 is connected to the output of emitter-follower transistor 32 to receive the contrast control pulses $P_k$ therefrom and to produce the time integral contrast signal $E_k$ which is applied as the contrast bias voltage to video amplifier 3. Also, in FIG. 4, integrator 42 is not connected to the output of emitter-follower transistor 41, as in the FIG. 2 embodiment. Rather, integrator 42 is connected between pulse generator 23 and transistor 41 so as to receive the color level control pulses $P_c$ and to supply the time integral color level signal to transistor 41. Still further, transistor 41 in the embodiment shown in FIG. 4 does not function merely as a simple emitter-follower transistor. Rather, the collector electrode of transistor 41 is connected to the emitter circuit of emitter-follower transistor 32 so as to receive the contrast control pulses $P_k$ at its collector electrode. As is appreciated, transistor 41 performs a multiplying function to multiply the time integral color level signal received at its base electrode from integrator 42 with the contrast control pulses $P_k$ received at its collector electrode from emitter-follower transistor 32. Thus, at the emitter output of transistor 41, there are produced pulses having a duty cycle equal to the duty cycle of the contrast control pulses $P_k$ and having an amplitude determined by the time integral color level signal, which time integral signal is a function of the duty cycle $T_c/S_c$ of the color level control pulses $P_c$. Stated otherwise, the emitter output of transistor 41 in the FIG. 4 embodiment is substantially the same as the emitter output of transistor 41 in the FIG. 2 embodiment. An additional integrator 42' integrates the pulses supplied thereto by transistor 41 to produce the color level bias voltage $E_c$ for controlling the gain of chrominance amplifier 12.

In the embodiment of FIG. 2, it is seen that integrator 31 integrates the contrast control pulses $P_k$ to produce a time integral contrast signal which, in turn, modulates the amplitude of the signal which is supplied by transistor 41 to integrator 42. Thus, the amplitude modulation of the signal supplied to integrator 42 is a function of the duty cycle of the contrast control pulses. In the embodiment of FIG. 4, integrator 42', connected to the output of transistor 41, serves to produce a time integral of the contrast control pulses $P_k$ which are supplied to transistor 41 and multiplied with the time integral color level signal. Hence, the amplitude of the time integral color level signal, produced by integrator 42 in FIG. 4, is modulated in accordance with the duty cycle of the contrast control pulses $P_k$. Thus, integrator 42', in FIG. 4, has the same effect upon contrast control pulses $P_k$ as integrator 31 in FIG. 2. Consequently, color level bias voltage $E_c$, produced by the circuit shown in FIG. 4, is represented by the duty cycle $T_c/S_c$ of color level control pulses $P_c$, due to the operation of integrator 42, multiplied by the contrast bias voltage $E_k$, due to the operation of multiplying transistor 41 and additional integrator 42'. As in the embodiment of FIG. 2, a change in the duty cycle of the contrast control pulses $P_k$ in response to a commanded contrast adjustment results in a corresponding change in the duty cycle of the multiplied pulses supplied to integrator 42'. As a result of the integration performed by integrator 42', a proportional change is effected in the color level bias voltage $E_c$. That is, the color level bias voltage may be expressed as $$E_c = (T_c \cdot E_k)/(S_c)$$

Hence, a change in the duty cycle of the contrast control pulses produces a corresponding change in the contrast bias voltage $E_k$ and a proportional change in the color level bias voltage $E_c$. An adjustment in contrast of the displayed video picture will be accompanied by a proportional adjustment in the color level thereof. Thus, contrast can be remotely controlled in one user-initiated operation, and without requiring first a contrast adjustment, then a compensating color level adjustment, and so on.

While the present invention has been particularly shown and described with reference to certain preferred embodiments, it will be readily apparent that various changes and modifications in form and details can be made by one of ordinary skill in the art without departing from the spirit and scope of the invention. For example, the particular type of remote transmitting/receiving apparatus need not be limited solely to ultrasonic devices. Infrared transmitting and receiving techniques, as well as other known remote-control techniques may be used. Furthermore, although pulse generator 23 has been shown as a single block, it is appreciated that individual pulse generators may be provided to produce the respective contrast and color level control pulses independently of each other. Also, the duty cycles of the contrast and color level control pulses can be changed in response to manual adjustment controls provided on the chassis or cabinet of the television receiver. Thus, the very same contrast and color level control circuitry can be used to adjust the contrast and/or color level of the video picture either by remote control techniques or by direct manual adjustment. It is, therefore, intended that the appended claims be interpreted as including the foregoing as well as all other such changes and modifications.

What is claimed is:

1. In television receiving apparatus of the type having a controllable video amplifier for amplifying a luminance signal and a controllable chrominance amplifier for amplifying a chrominance signal, control circuitry for selectively controlling the contrast of a video picture displayed by said television receiving apparatus and for selectively controlling the color level of said video picture comprising pulse generating means for generating contrast control pulses of selectively variable duty cycle and color level control pulses of selectively variable duty cycle; contrast control means responsive to said contrast control pulses for generating a contrast control signal in accordance with the duty cycle of said contrast control pulses; means for using said contrast control signal to control the gain of said video amplifier so as to correspondingly control the contrast of said video picture; color control means responsive to said color level control pulses for generating a color level control signal in accordance with the duty cycle of said color level control pulses; means for changing said color level control signal proportionally with a change in said contrast control signal so as to maintain a substantially constant chrominance-to-luminance signal ratio despite changes in said contrast control signal; and means for using said color level control signal to control the gain of said chrominance amplifier so as to correspondingly control the color level of said video picture.

2. The apparatus of claim 1 wherein said control circuitry is responsive to remote contrast and color level command signals, and further comprising decoding means for decoding received command signals to change the duty cycle of said contrast control pulses in accordance with a received contrast command signal and to change the duty cycle of said color level control pulses in accordance with a received color level command signal.

3. The apparatus of claim 1 or 2 wherein said color control means comprises color level integrating means for producing a time integral color level signal as a function of the duty cycle of said color level control pulses; and means for changing said time integral color level signal as a function of said contrast control pulses to derive an output color level control signal, said output color level control signal being applied to said chrominance amplifier.

4. The apparatus of claim 3 wherein said contrast control means comprises contrast integrating means for producing a time integral contrast signal as a function of the duty cycle of said contrast control pulses; and said means to derive an output color level control signal comprises modulating means supplied with said color level control pulses and said time integral contrast signal for amplitude modulating said color level control pulses with said time integral contrast signal, said amplitude modulated color level control pulses being supplied to said color level integrating means and said output color level control signal being produced by said color level integrating means.

5. The apparatus of claim 4 wherein said modulating means comprises a slicing circuit having a slicing level established by said time integral contrast signal; and further comprising emitter-follower means having an input coupled to said slicing circuit for receiving said color level control pulses of amplitude which does not exceed said slicing level and an output coupled to said color level integrating means.

6. The apparatus of claim 5 wherein said contrast control means further comprises emitter-follower means having an input coupled to said contrast integrating means and an output coupled to said video amplifier and to said slicing circuit for supplying said time integral contrast signal thereto.

7. The apparatus of claim 3 wherein said means to derive an output color level control signal comprises multiplying means for receiving said time integral color level signal and said contrast control pulses to produce output pulses having an amplitude determined by said time integral color level signal and a duty cycle determined by said contrast control pulses; and further integrating means to integrate said output pulses and thereby derive said output color level control signal.

8. The apparatus of claim 7 wherein said contrast control means comprises contrast integrating means for producing a time integral contrast signal as a function of the duty cycle of said contrast control pulses, said time integral contrast signal being applied to said video amplifier as said contrast control signal therefor.

9. The apparatus of claim 8 wherein said multiplying means comprises transistor means having a base circuit connected to receive said time integral color level signal, a collector circuit connected to receive said contrast control pulses, and an emitter circuit for providing said output pulses and connected to supply said output pulses to said further integrating means; and wherein said contrast control means further comprises emitter-follower means connected to receive said contrast control pulses and to supply same to said transistor collector circuit and to said contrast integrating means.

* * * * *